Nov. 11, 1958 J. E. LINDSAY 2,860,193

STABILIZED TRANSISTOR AMPLIFIER

Filed April 1, 1954

INVENTOR.
JAMES E. LINDSAY
BY
H. W. Newton

United States Patent Office 2,860,193

Patented Nov. 11, 1958

2,860,193

STABILIZED TRANSISTOR AMPLIFIER

James E. Lindsay, Moorestown, N. J., assignor to Radio Corporation of America, a corporation of Delaware Application April 1, 1954, Serial No. 420,421

7 Claims. (Cl. 179—171)

Figure 1:
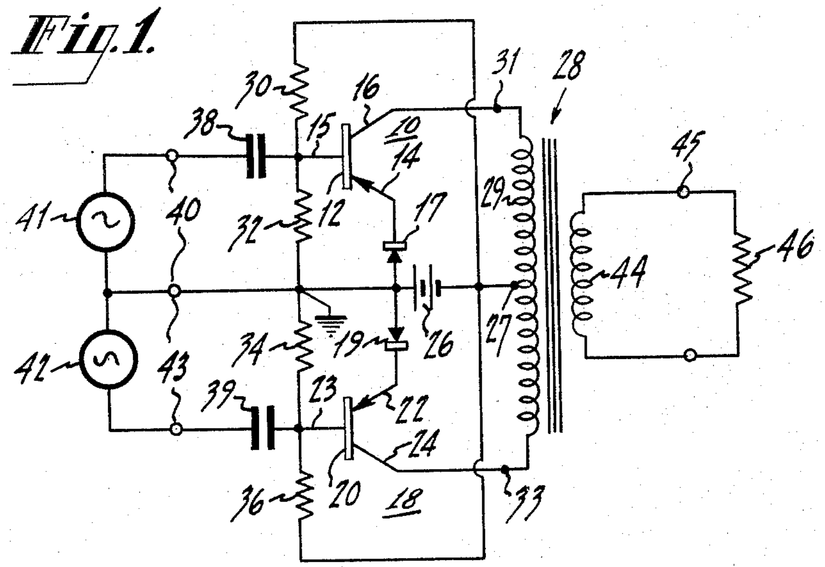

This invention relates generally to signal amplifiers having two signal paths arranged for push-pull operation and particularly to circuits for stabilizing semiconductor signal amplifiers of that type.

In many signal translating systems, signal amplifier circuits connected for class B operation are preferred because of their relatively high circuit efficiency and large power output. Thus class B circuits have been utilized in power amplifiers and in pulse amplifiers in which electron discharge devices are used. The advantages of class B operation are relatively greater when semiconductor devices or transistors are utilized because of the greater signal circuit efficiency of these devices, and because in addition no heater power is required.

Transistors are available which are of opposite conductivity types, and two such transistors may be arranged to provide push-pull operation without the normal inconvenience of balanced operation. Thus a signal of one polarity introduced into the input circuit of a transistor of one conductivity type may cause its output current to increase, while a signal of the same polarity introduced into the input circuit of a transistor of opposite conductivity type will cause the output current of the latter transistor to decrease. Accordingly, two transistors of opposite conductivity type may be arranged in two parallel signal paths to achieve push-pull operation.

A difficulty which has been encountered in the past in connection with class B amplifiers utilizing transistors is that an excessive and variable value of zero signal or idling current may be drawn by the output circuit of the transistor. This current is subject to control by application of suitable bias currents to the transistor input circuit. Methods for controlling this current which have been used in the past involve greatly lowered circuit efficiency or complexity of circuit configuration.

One method of reducing the otherwise excessive idling current is to provide a reverse bias current to the base electrode of the transistor in order to reduce the aforementioned idling current. If this method is used, the transistor may not amplify the complete half cycle of an input signal, and a type of distortion known as cross-over distortion results. It is, therefore, required that this reverse bias be reduced under signal conditions in order to eliminate this cross-over distortion.

The variation in idling current may be materially reduced by keeping the D.-C. resistance in the base circuit low. One method for accomplishing this is to use transformer coupling to the base or input circuit. However, in view of the fact that for proper operation of the amplifier, a small forward bias voltage must be applied to the base electrode relative to the emitter electrode, a source of potential must be connected in series with the secondary winding of the transformer.

Considerations of economy will often dictate that resistance-capacitance rather than transformer coupling be employed. The necessary bias voltage may be applied in this case from a source of potential connected in series with a resistor which is in turn connected to the base electrode. This resistor must have a large enough value that most of the A.-C. signal current flows into the input circuit of the transistor.

With resistance coupling, therefore, it may not be possible to realize to the fullest extent the advantages of a low resistance bias connection in the base circuit. One method of overcoming this difficulty with resistance coupling is to connect a resistor in series with the emitter electrode as described by H. L. Barney, in United States Patent 2,647,958, issued August 4, 1953, for Voltage And Current Bias Of Transistors.

This patent shows that the D.-C. operating point of the transistor is stabilized with the use of a resistor so connected. Use of this resistor, however, will cause the input impedance to be raised, thereby making this class B transistor circuit more difficult to drive. Because of the large variation in emitter current under signal conditions, it is normally not desirable to use a capacitor to bypass the resistor in series with the emitter electrode.

Accordingly, it is a primary object of the present invention to provide stabilizing network for a class B signal amplifier utilizing semiconductor devices.

It is further the object of this invention to provide in a class B signal amplifier a stabilizing circuit of simple configuration to provide high efficiency of operation.

It s the still further object of this invention to provide in a class B signal amplifier utilizing semiconductor devices, stabilization of the idling D.-C. operating point.

It s still a further object of this invention to provide in a class B amplifier a large degree of D.-C. stabilization with very little A.-C. degeneration.

These and further objects of the present invention may be accomplished by the series connection in the order named of a diode and a resistor or relatively low resistance between the emitter and base electrodes of each output stage transistor. The junction between these two elements is connected to ground or other point of reference potential and a relatively small forward bias is applied to each of the base electrodes. Under idling conditions, the diode offers a relatively high resistance to the passage of emitter current thereby providing stabilization of the D.-C. operating point. The magnitude of the idling current, therefore, does not vary greatly with variation in transistor characteristics.

Under signal conditions, however, the emitter current of the transistor increases, a direct result of which is to reduce the resistance of the diode markedly. The degeneration under signal conditions is thereby reduced, causing the output transistor to be relatively easy to drive.

The principle of this invention may be embodied in the push-pull class B amplifier circuit of either the balanced or single-ended type. The balanced push-pull circuit utilizes two transistors of the same conductivity type, whereas the push-pull amplifier of the single-ended type utilizes two transistors of opposite conductivity type.

Figure 2:
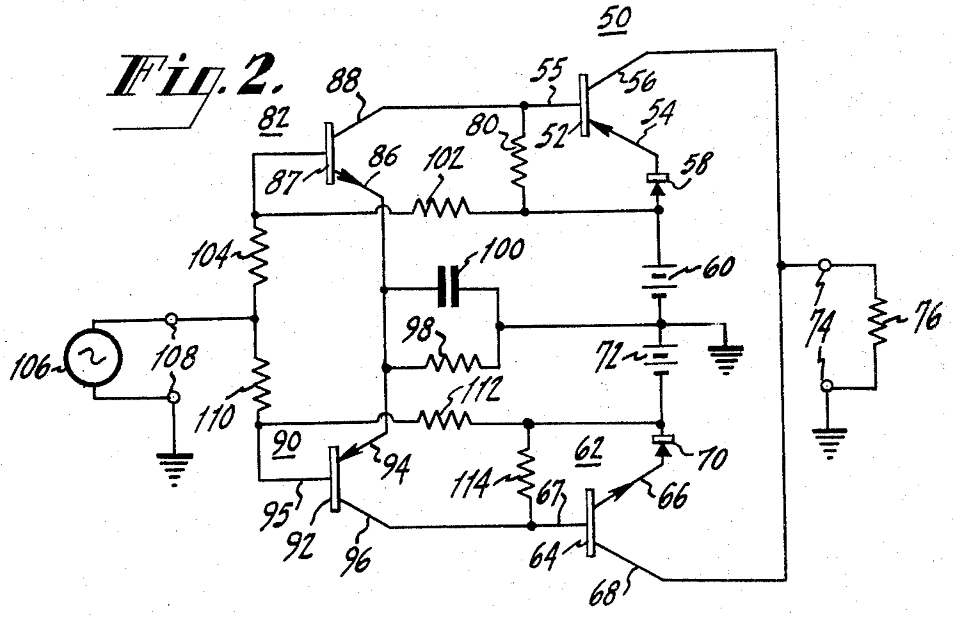

The novel features that are considered characteristic of this invention are set forth with particularity in the appended claims. The invention itself, however, both as to its organization and method of operation as well as additional objects and advantages, thereof, will be best understood from the following description when read in connection with the accompanying drawing in which:

Figure 1 is a schematic circuit diagram of a push-pull, balanced class B transistor amplifier connected for base input, collector output operation and stabilized in accordance with the present invention; and Figure 2 is a schematic circuit diagram of push-pull, single-ended class B transistor amplifier and driver circuit showing the stabilization method in accordance with the present invention.

Referring now to the drawing and particularly to Figure 1, a pair of transistors 10 and 18 are connected in a push-pull balanced amplifier circuit. The primary winding 29 of an output transformer 28 has one end terminal 31 connected to a collector electrode 16 of the transistor 10 and has another end terminal 33 connected to a collector electrode 24 of the transistor 18. An input circuit comprises two pairs of input terminals 40 and 43 which are connected respectively through a pair of coupling capacitors 38 and 39 to the base electrode 15 of the transistor 10 and the base electrode 23 of the transistor 18. One terminal of each of the pairs of input terminals 40 and 43 is connected to a point of substantially fixed reference potential or ground.

Input signals may be applied to the two pairs of input terminals 40 and 43 from any convenient balanced source of signals represented in the drawing by two generators 41 and 42 which are oppositely phased. Of course, these signals could be derived from a transformer or a phase inverter.

A source of energizing potential illustrated as a battery 26 has one terminal grounded, the other terminal being connected to a center tap 27 on the primary winding of the output transformer 28. A pair of diodes 17 and 19 are connected respectively between ground and each of the emitter electrodes 14 and 22 of the transistors 10 and 18. A pair of resistors 30 and 36 are connected between the center tap 27 of the primary winding 29 and a base electrode 15 of the transistor 10 and a base electrode 23 of the transistor 18 respectively, in order to provide a small amount of forward bias to each base electrode. A pair of resistors 32 and 34 are connected between the base electrode 15 and ground and the base electrode 23 and ground respectively, thereby providing a relatively low resistance path between each base electrode and ground.

In Figure 2, to which reference is now made, two transistors 50 and 62 of opposite conductivity type are connected in a complementary symmetry output circuit embodying the present invention. Included also in Figure 2 is a complementary symmetry driver stage including two transistors 82 and 90, also of opposite conductivity type. The transistor 50, which for purpose of illustration is shown to be of the P-N-P type, includes an emitter electrode 54, a base electrode 55 and a collector electrode 56 attached thereto.

As in the case of the circuit of Figure 1, a diode 58, poled to pass currents which bias the emitter electrode in the forward direction relative to the base electrode, and a resistor 80 are connected in series in the order named between the emitter electrode 54 and the base electrode 55. The junction of these two elements is connected to the positive terminal of a battery 60, the negative terminal of which is grounded.

The collector electrode 56, is connected to ground through a pair of output terminals 74 across which is connected a utilization device 76, thus, completing the D.-C. output circuit for the transistor 50.

The output stage also includes a N-P-N transistor 62 having an emitter electrode 66, a base electrode 67 and a collector electrode 68. A diode 70, poled to pass currents which bias the emitter electrode 66 in the forward direction relative to the base electrode 67, and a resistor 114 are connected in series in the order named between the emitter electrode 66, and the base electrode 67. The negative terminal of a battery 72 is connected to the junction of the diode 70 and the resistor 114, the positive terminal of the battery 72 being grounded. The D.-C. output circuit of transistor 62, is completed through the utilization device 76, which is coupled to the collector electrode 68, through a pair of output terminals 74.

The D.-C. output energizing current flowing in the utilization device consists of two components, namely the current flowing in the collector electrode 56, and that flowing in the collector electrode 68. These two components flow in opposite directions through the utilization device 76. If in the proper operation of this output stage the energizing currents for the two transistors are made equal, the net energizing current flowing in the utilization device will be zero. The D.-C. energizing current, therefore, flows in series through the output circuits of the two transistors while the two transistors supply signal currents in parallel to the utilization device 76. The utilization device, therefore, need not provide a D.-C. conductive path.

Signals are applied to the base electrodes 55 and 67 from a complementary symmetry driver stage which includes an N-P-N transistor 82, having an emitter electrode 86, a base electrode 87 and a collector electrode 88, and a P-N-P transistor 90 also including an emitter electrode 94, a base electrode 95 and a collector electrode 96. The emitter electrodes 86 and 94 are connected together and are returned to ground through a stabilizing resistor 98 which is bypassed at signal frequency by a bypass capacitor 100. The collector electrode 88 of the N-P-N driver transistor 82 is directly connected to the base electrode 55 of the P-N-P output transistor 50. The collector electrode 96 of the P-N-P driver transistor is similarly connected to the base electrode 67. The direct connection of the collector electrodes of the driver stage to the base electrodes of the output stage simultaneously provides the required forward bias current for the base electrodes of the output stage and collector energizing current for the collector electrodes of the driver stage.

Adjustment of these currents is accomplished by the connection of a bias network in the base electrode circuit of the driver transistors 82 and 90. A resistor 102 is connected between the positive terminal of the battery 60 and the base electrode 87 and provides forward bias for transistor 82; a resistor 112 connected between the negative terminal of the battery 72 and the base electrode 95 performs a similar function for the transistor 90. The resistors 104 and 110, which are of relative low resistance, are connected in series between the base electrodes 87 and 95. These resistors 104 and 110 help to stabilize the D.-C. operating point of the transistors 82 and 90. The junction between them is connected to one of a pair of input terminals 108 to which an input signal generator 106 is coupled, the other of the pair of input terminals 108 being connected to ground.

Each output stage transistor of Figure 2, operates in the same fashion as each individual transistor of Figure 1. The combination of two transistors of opposite conductivity type allows parallel single-ended operation of both transistors while still maintaining push-pull operation as required for a class B amplifier. For circuit convenience of grounding both the sources of supply potential and the utilization device, the batteries 60 and 72 are connected in series respectively with the emitter electrodes of the output transistors 50 and 62.

The small amount of forward bias which is required for the proper operation of the output transistors under idling conditions is supplied by the collector current of each driver transistor. Since the forward bias requirement is small, the driver collector current is necessarily small so that the driver transistors of the circuit illustrated in Figure 2 are also operated in class B. It is, of course, possible to operate the driver transistors in class A if provision is made for the application of forward bias to the base electrodes of the output stage separately from the collector current of the driver stage.

This type of operation is illustrated for the balanced amplifier in Figure 1.

The class B driver stage must be carefully designed to provide the proper forward bias current for the output stage transistors. This is accomplished in the circuit of Figure 2 by means of the driver stage stabilization network as described above.

Input signals from the generator 106 are applied simultaneously to the base electrodes 87 and 95 of the driver stage. During the positive half cycle of the input wave the current flowing to the base electrode 87 causes an increase in the collector current of the transistor 82 which in turn increases the current flowing out of the base electrode 55. Thus, a positive output signal is generated across the pair of output terminals 74. During the same positive half cycle of input signal, the base electrode 95 is biased in a reverse direction relative to the emitter electrode 94, thereby slightly reducing the collector current of the P-N-P driver transistor 90, and reducing the base current flowing into the base electrode 67. Thus the signal path comprising the transistors 90 and 62 is inoperative during positive input signals. In similar fashion the signal path comprising transistors 82 and 50 is inoperative during negative input signals.

The novel feature of the present invention provide a stabilizing network of simple configuration for use with a class B amplifier. This network provides for efficient and stabilized operation of the amplifier with very little A.-C. degeneration. Use of this invention, therefore permits high gain to be obtained from a stabilized class B amplifier circuit.

What is claimed is:

1. In a class B signal amplifier, the combination comprising a pair of semiconductor devices each having base, emitter and collector electrodes, an input circuit connected for applying input signals between each of said base electrodes and a common point for said amplifier, means including a source of energizing potential connected for biasing said collector electrodes, direct current conductive resistance means and a unidirectionally conducting device connected in series in the order named between the base and emitter electrodes of each of said semiconductor devices and poled to pass forward current to bias each of said emitter electrodes in a forward direction relative to the respective base electrode, said unidirectionally conducting devices providing a relatively high degenerative resistance to emitter current under static operating conditions to stabilize the direct-current operating point of said semi-conductor devices and a relatively low resistance upon the application of input signals to said semi-conductor devices to reduce emitter circuit degeneration under signal conditions, the junction of said direct current conductive means and said unidirectionally conducting devices being connected to said common point, and an output circuit coupled with said collector electrodes.

2. In a class B signal amplifier, the combination comprising a pair of semiconductor devices each having base, emitter and collector electrodes, a unidirectionally conducting device connected with the emitter electrode of each one of said pair of semi-conductor devices and respectively poled to pass forward currents to bias each of said emitter electrodes in a forward direction relative to the respective base electrodes, said unidirectionally conducting devices providing a relatively high degenerative resistance to emitter current under static operating conditions to stabilize the direct-current operating point of said semi-conductor devices and a relatively low resistance upon the application of input signals to said semi-conductor devices to reduce emitter circuit degeneration under signal conditions, direct current conductive resistance means connected between each of said base electrodes and the junction of said unidirectionally conducting devices, means providing a direct current conductive path and including a source of energizing potential for providing current to bias each of said base electrodes in a forward direction relative to the respective emitter electrode, means including said source of energizing potential connected for biasing said collector electrodes in a reverse direction relative to said base electrodes, an input circuit for applying input signals to said base electrodes, and a load means coupled with said collector electrodes.

3. In a class B signal amplifier, the combination comprising a pair of semiconductor devices of opposite conductivity type, each including base, emitter and collector electrodes, an input circuit coupled in common with said base electrodes for applying input signals thereto, a unidirectionally conducting device and a direct current conductive resistance element connected in series in the order named between the emitter and base electrodes of each one of said pair of semiconductor devices, said unidirectionally conducting devices providing a relatively high degenerative resistance to emitter current under static operating conditions to stabilize the direct-current operating point of said semi-conductor devices and a relatively low resistance upon the application of input signals to said semi-conductor devices to reduce emitter circuit degeneration under signal conditions, a source of energizing potential coupled between said emitter electrodes through said unidirectionally conducting devices for providing a series direct current path through said pair of semiconducter devices, direct current conductive resistance means connected between each of said base electrodes and an intermediate point on said source of energizing potential for biasing each of said base electrodes in a forward direction relative to the respective emitter electrode, and load means connected in common with said collector electrodes.

4. In a class B signal amplifier, the combination comprising a pair of semiconductor devices of opposite conductivity type, each including base, emitter and collector electrodes, said collector electrodes being coupled in common and said base electrodes being coupled in common, a unidirectionally conducting device connected with the emitter electrode of each of said pair of semi-conductor devices and poled to pass forward currents to bias each of said emitter electrodes in a forward direction relative to the respective base electrode, said unidirectionally conducting devices providing a relatively high degenerative resistance to emitter current under static operating conditions to stabilize the direct-current operating point of said semi-conductor devices and a relatively low resistance upon the application of input signals to said semiconductor devices to reduce emitter circuit degeneration under signal conditions, a source of energizing potential connected between and in series with said unidirectionally conducting devices, load means connected between said collector electrodes and a tap on said source of energizing potential, an input circuit connected between said base electrodes and said tap, and direct conductive resistance means connected between each of said base electrodes and said tap.

5. In a class B amplifier, the combination comprising a pair of semiconductor devices, each having base, emitter and collector electrodes, an input signal circuit coupled between said base electrodes, a pair of unidirectionally conducting devices connected between said emitter electrodes and poled to pass forward currents to bias each of said emitter electrodes in a forward direction relative to the respective base electrode, said unidirectionally conducting devices providing a relatively high degenerative resistance to emitter current under static operating conditions to stabilize the direct-current operating point of said semiconductor devices and a relatively low resistance upon the application of input signals to said semi-conductor devices to reduce emitter circuit degeneration under signal conditions, a centertapped load means connected between said collector electrodes, a source of energizing potential connected between the junction of said unilaterally conducting devices and said centertap, direct current conductive resistance means connected between each of said base electrodes and said junction, and means connected with said source of energizing potential for applying forward bias current to each of said base electrodes.

6. A class B amplifier circuit as defined in claim 5 wherein said direct current conductive resistance means comprises a pair of resistors.

7. In a class B signal amplifier, the combination comprising a first pair of transistors each having base, emitter and collector electrodes, means including a source of energizing potential and a load element connected in series for biasing said collector electrodes, a first direct current conductive resistance means and a unidirectionally conducting device connected in series in the order named between the base and emitter electrodes of each of said semiconductor devices and poled to pass forward currents to bias each of said emitter electrodes in a forward direction relative to the respective base electrode, said unidirectionally conducting devices providing a relatively high degenerative resistance to emitter current under static operating conditions to stabilize the direct-current operating point of said transistors and a relatively low resistance upon the application of input signals to said transistors to reduce emitter circuit degeneration under signal conditions, a second direct current conductive resistance means coupled between each of said base electrodes and the junction of said load element and said source of energizing potential, said direct current conductive means including a second pair of transistors, each having base, emitter and collector electrodes, an input circuit connected for applying input signals to each of the base electrodes of said second pair of transistors, whereby said second pair of transistors provides input signals to the base electrodes of said first pair of transistors.

References Cited in the file of this patent

UNITED STATES PATENTS

| | | |
|---|---|---|
| 2,647,957 | Mallinckrodt | Aug. 4, 1953 |
| 2,647,958 | Barney | Aug. 4, 1953 |
| 2,662,122 | Ryder | Dec. 8, 1953 |
| 2,680,160 | Yaeger | June 1, 1954 |

OTHER REFERENCES

Alexanderson article, Proc. I. R. E., November 1952, pages 1508–1511.